(12) United States Patent
Fischer et al.

(10) Patent No.: US 9,293,409 B2
(45) Date of Patent: Mar. 22, 2016

(54) METHOD FOR MANUFACTURING A SEMICONDUCTOR DEVICE, AND SEMICONDUCTOR DEVICE

(71) Applicant: Infineon Technologies AG, Munich (DE)

(72) Inventors: Thomas Fischer, Regensburg (DE); Carsten Ahrens, Pettendorf (DE); Damian Sojka, Regensburg (DE); Andre Schmenn, Sachsenkam (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/023,493

(22) Filed: Sep. 11, 2013

(65) Prior Publication Data

US 2015/0069591 A1    Mar. 12, 2015

(51) Int. Cl.
*H01L 21/48* (2006.01)
*H01L 23/522* (2006.01)
(Continued)

(52) U.S. Cl.
CPC .......... *H01L 23/522* (2013.01); *H01L 21/7685* (2013.01); *H01L 21/784* (2013.01); *H01L 23/562* (2013.01); *H01L 24/27* (2013.01); *H01L 24/29* (2013.01); *H01L 24/94* (2013.01); *H01L 24/98* (2013.01); *H01L 23/4827* (2013.01); *H01L 24/05* (2013.01); *H01L 24/32* (2013.01); *H01L 24/48* (2013.01); *H01L 2224/04026* (2013.01); *H01L 2224/0569* (2013.01); *H01L 2224/05082* (2013.01); *H01L 2224/05124* (2013.01); *H01L 2224/05166* (2013.01); *H01L 2224/05647* (2013.01); *H01L 2224/2746* (2013.01); *H01L 2224/2747* (2013.01); *H01L 2224/291* (2013.01); *H01L 2224/2916* (2013.01); *H01L 2224/2919* (2013.01); *H01L 2224/29111* (2013.01); *H01L 2224/29118* (2013.01); *H01L 2224/29139* (2013.01); *H01L 2224/29144* (2013.01);
(Continued)

(58) Field of Classification Search
CPC ... H01L 23/522; H01L 23/482; H01L 23/562; H01L 21/784; H01L 21/7685; H01L 2224/48247; H01L 2224/94; H01L 2224/27; H01L 24/98; H01L 2924/10253; H01L 2924/10252
USPC ......... 438/113–114, 123, 106, 459, 458, 460, 438/465
See application file for complete search history.

(56) References Cited

U.S. PATENT DOCUMENTS 6,133,071 A    10/2000  Nagai
2009/0026470 A1  1/2009  Lai et al.
(Continued)

FOREIGN PATENT DOCUMENTS

JP    H11-121475 A    4/1999
JP    2004-303913 A   10/2004
(Continued)

*Primary Examiner* — Hoa B Trinh (57) ABSTRACT

According to various embodiments, a method for manufacturing a semiconductor device may include providing a semiconductor workpiece including a device region at a first side of the semiconductor workpiece, wherein a mechanical stability of the semiconductor workpiece is insufficient to resist at least one back end process without damage, and depositing at least one conductive layer over a second side of the semiconductor workpiece opposite the first side of the semiconductor workpiece, wherein the at least one conductive layer increases the mechanical stability of the semiconductor workpiece to be sufficient to resist the at least one back end process without damage.

14 Claims, 2 Drawing Sheets

(51) Int. Cl.
 H01L 21/768 (2006.01)
 H01L 23/00 (2006.01)
 H01L 21/784 (2006.01)
 H01L 23/482 (2006.01)

(52) U.S. Cl.
 CPC ............... *H01L2224/29147* (2013.01); *H01L 2224/29155* (2013.01); *H01L 2224/29164* (2013.01); *H01L 2224/29166* (2013.01); *H01L 2224/32245* (2013.01); *H01L 2224/48247* (2013.01); *H01L 2224/94* (2013.01); *H01L 2924/1032* (2013.01); *H01L 2924/1037* (2013.01); *H01L 2924/10252* (2013.01); *H01L 2924/10253* (2013.01); *H01L 2924/10272* (2013.01); *H01L 2924/10329* (2013.01); *H01L 2924/10335* (2013.01); *H01L 2924/10337* (2013.01); *H01L 2924/12042* (2013.01); *H01L 2924/1431* (2013.01)

(56) References Cited

U.S. PATENT DOCUMENTS

2012/0168916 A1    7/2012  Chi et al.
2013/0299974 A1*  11/2013  Chi et al. ................. 257/737

FOREIGN PATENT DOCUMENTS

KR    2009-0010868  A    1/2009
KR    2009-0016121  A    2/2009

* cited by examiner

METHOD FOR MANUFACTURING A SEMICONDUCTOR DEVICE, AND SEMICONDUCTOR DEVICE

TECHNICAL FIELD

Various embodiments relate to a semiconductor device and a manufacturing method thereof.

BACKGROUND

As high data rate interfaces such as Universal Serial Bus (USB) 3.0, High-Definition Multimedia Interface (HDMI) or Thunderbolt make their way to a huge number of applications, the need for a highly effective electrostatic discharge (ESD) protection device is growing. The intrinsic ESD device resistance needs to be very low in order to properly discharge critical ESD incidents. The silicon (Si) substrate is a main contributor to the intrinsic resistance (e.g. makes up to 70%) of the ESD device. The ESD device may include one or more diodes, and thus, the performance of these diodes may improve with thinner silicon. When lowering the silicon thickness down to below 35 µm, a variety of new processing issues may occur. The mechanical stability of the chip may decrease to an extent that traditional preassembly and packaging processes (e.g. dicing, die pick) may result in unwanted chip damage like chipping or chip cracks.

As the current flow in an ESD device may be through the silicon (vertical current direction), the wafer backside may be provided with a metal contact. This metal layer may be deposited on the wafer backside acting as a solder layer. This may be to achieve a good electrical contact of the silicon to the lead frame and to mechanically attach the chip to the lead frame. Conventionally, the metal layer may be sputtered on the wafer and the metal layer may be separated at the same time as the silicon using a mechanical wafer dicing process, e.g. sawing. Sawing silicon and metal at the same time may be critical due to metal sticking on the sawing blade. Dicing defects may occur as the blade may change its properties due to blocking of the diamond grains of the dicing blade. The process window for excellent dicing performance may be limited by the ratio of silicon thickness (higher is better) and metal thickness (lower is better). Thus lowering the silicon thickness may cause an increase in dicing issues.

Further, in a typical die pick process, there may be a needle which lifts the chip from below a dicing foil to reduce the adhesion force (of the dicing foil to the wafer backside), and at the same time there may be a vacuum handler gripping the chip from the front side, transporting the chip to a lead frame. Ultra thin chips may tend to break because the little piece of silicon may not be able to withstand the mechanical force of foil detaching and the force from the push needle from down below. This may be critical especially for very small chip size.

Today, the chip thickness may be limited by manufacturability or manufacturing processes as described above, where for the resulting products, this means that there may be a hard limit on their performance.

SUMMARY

According to an embodiment, a method for manufacturing a semiconductor device is provided. The method may include providing a semiconductor workpiece including a device region at a first side of the semiconductor workpiece, wherein a mechanical stability of the semiconductor workpiece is insufficient to resist at least one back end process without damage, and depositing at least one conductive layer over a second side of the semiconductor workpiece opposite the first side of the semiconductor workpiece, wherein the at least one conductive layer increases the mechanical stability of the semiconductor workpiece to be sufficient to resist the at least one back end process without damage.

According to an embodiment, a semiconductor device is provided. The semiconductor device may include a semiconductor workpiece including a device region at a first side of the semiconductor workpiece, wherein a mechanical stability of the semiconductor workpiece is insufficient to resist at least one back end process without damage, and at least one conductive layer deposited over a second side of the semiconductor workpiece opposite the first side of the semiconductor workpiece, wherein the at least one conductive layer increases the mechanical stability of the semiconductor workpiece to be sufficient to resist the at least one back end process without damage.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The word "about" as applied to a numeric value encompasses the exact value and a reasonable variance.

Various embodiments may provide a chip based metal carrier system, for example for chips that may benefit from a thin or very thin semiconductor (e.g. silicon) thickness (e.g. less than or equal to about 50 µm, e.g. about 20 µm), e.g. logic chips, e.g. vertical diode products, e.g. ESD protection devices.

Various embodiments may provide a semiconductor (e.g. silicon) device and a method for manufacturing the same. An aspect of various embodiments is to reduce the semiconductor (e.g. silicon) thickness, for example of a semiconductor workpiece such as e.g. a wafer or chip, may be reduced down to an optimum level for product performance, which may for example be in the 20 µm range. At this silicon thickness, the manufacturing problems associated with conventional approaches may become very dominant, thereby ruining yield and quality. Nevertheless, these challenges may be addressed in various embodiments by making or forming a conductive backside, e.g. a metal backside (e.g. metallization layer on the back side of the semiconductor workpiece, e.g. back side metallization of a chip) thick enough to give the semiconductor workpiece (e.g. chip) or semiconductor device the mechanical stability needed to survive the mechanical force that may be imprinted or generated by the manufacturing processes (e.g. back end processes or chip packaging processes, e.g. dicing (e.g. sawing), die pick, and/or die attach). The metal backside may be deposited in a way that there is very little or small amount of metal in the kerf areas or regions where the dicing happens, and very much or a higher amount of metal in the chip area where the device performance is created and to provide the mechanical stability that is needed for the dicing/die attach process.

Further, an aspect of various embodiments is to use the backside metal layer or stack as a mechanical carrier on chip level and, at the same time, fully pattern the metal backside layer or stack on wafer level to keep or maintain a decent dicing quality by reducing the metal blocking of a sawing blade to a minimum or enabling modern dicing options, for example plasmadicing.

Various embodiments may enable manufacturing of ultra thin chips, e.g. chips having a thickness of less than 50 µm, e.g. about 20 µm. Various embodiments may enable handling of ultra thin chips in preassembly and assembly.

An aspect of various embodiments may be that by reducing the thickness of a semiconductor area (e.g. silicon area) of a semiconductor device, e.g. a vertically integrated component, e.g. a vertical diode, e.g. ESD diode, an electrical resistance of the semiconductor device (for vertical current flow through the device) may be reduced. In accordance with one or more embodiments, the semiconductor material (e.g. silicon), which may conventionally serve to ensure stability of a component during handling (e.g. during packaging) and which may have a relatively high resistance, may be replaced by a material (e.g. a metal or metal alloy) with almost no resistance.

Figure 1A:
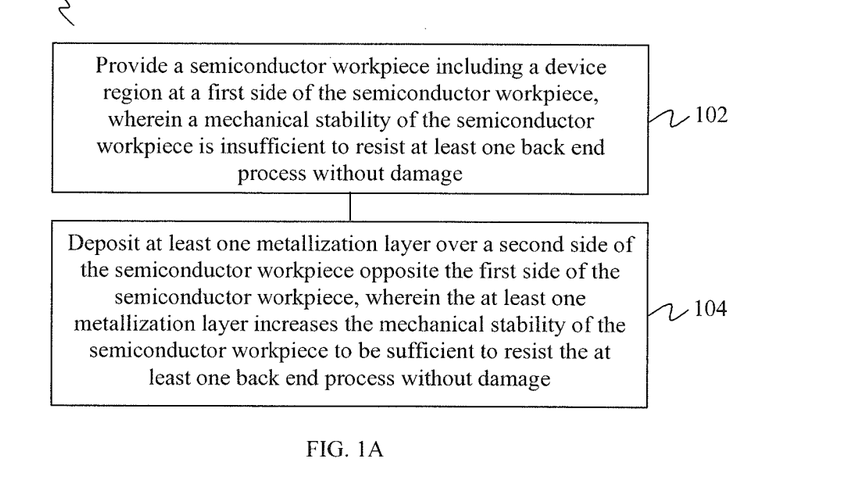
FIG. 1A shows a flow chart illustrating a method for manufacturing a semiconductor device, according to various embodiments.

FIG. 1A shows a flow chart 100 illustrating a method for manufacturing a semiconductor device, according to various embodiments.

At 102, a semiconductor workpiece including a device region at a first side of the semiconductor workpiece is provided, wherein a mechanical stability of the semiconductor workpiece is insufficient to resist at least one back end process without damage (e.g. mechanical damage such as chipping, cracks, or the like).

At 104, at least one conductive layer (e.g. metallization layer) is deposited over a second side of the semiconductor workpiece opposite the first side of the semiconductor workpiece, wherein the at least one conductive layer (e.g. metallization layer) increases the mechanical stability of the semiconductor workpiece to be sufficient to resist the at least one back end process without damage.

In one or more embodiments, the at least one back end process may include or be a process or processing step that is carried out in the back end of a semiconductor device (e.g. integrated circuit (IC) or chip) fabrication process flow.

In one or more embodiments, the at least one back end process may include or be a process or processing step in a semiconductor device (e.g. integrated circuit (IC) or chip) fabrication process flow that is carried out after the front end processes of the semiconductor device (e.g. integrated circuit (IC) or chip) fabrication process flow have been completed.

In one or more embodiments, the at least one back end process may include or be a process or processing step in a semiconductor device (e.g. integrated circuit (IC) or chip) fabrication process flow that is carried out after front-end-of-line (FEOL) and back-end-of-line (BEOL) processing of the semiconductor device (e.g. integrated circuit (IC) or chip) has been completed, e.g. after wiring of one or more electric or electronic elements (e.g. transistors, diodes, capacitors, resistors, etc.) of the semiconductor device (e.g. integrated circuit (IC) or chip) has been completed.

In one or more embodiments, the at least one back end process may include or be at least one of: a preassembly process, an assembly process, a packaging process, for example a chip packaging process.

In various embodiments, the at least one conductive layer (e.g. metallization layer) (over the second side of the workpiece) may serve as a mechanical carrier in the at least one back end process.

In various embodiments, the at least one back end process may include or be at least one of: a dicing process (e.g. a sawing process, a plasma dicing process, a laser dicing process, a stealth dicing process, or the like), a die pick process, a die attach process, a wire bonding process.

In various embodiments, the at least one conductive layer (e.g. metallization layer) may increase the mechanical stability of the semiconductor workpiece to be sufficient to resist an entire back end processing (in other words, all back end processes or processing steps) without damage.

In the context of various embodiments, at 104, depositing the at least one conductive layer (e.g. metallization layer) over the second side of the semiconductor workpiece may include covering the second side of the semiconductor workpiece with the at least one conductive layer (e.g. metallization layer) except for a kerf region of the semiconductor workpiece.

In various embodiments, the method may further include dicing the semiconductor workpiece along the kerf region after depositing the at least one conductive layer (e.g. metallization layer). Dicing the semiconductor workpiece along the kerf region may include sawing the semiconductor workpiece along the kerf region, and/or plasma dicing the semiconductor workpiece along the kerf region. Alternatively or in addition, dicing the semiconductor workpiece along the kerf region may include other dicing techniques such as laser dicing, stealth dicing, or any other suitable dicing technique.

In various embodiments, by means of dicing the semiconductor workpiece (e.g. wafer), one or more dies or chips may be obtained.

In various embodiments, the semiconductor workpiece may include a wafer, e.g. a semiconductor wafer (e.g. a silicon (Si) wafer, although other types of wafers may be possible as well).

In the context of various embodiments, at 104, depositing the at least one conductive layer (e.g. metallization layer) may include a plating process. For example, the at least one conductive layer (e.g. metallization layer) may be deposited over the second side of the semiconductor workpiece by at least one of: plating, galvanic deposition, electrogalvanic deposition, electrochemical deposition, electroplating.

In various embodiments, a thickness of the semiconductor workpiece may be such that the mechanical stability of the semiconductor workpiece is insufficient to resist the at least one back end process without damage, and a thickness of the at least one conductive layer (e.g. metallization layer) may be such that the mechanical stability of the semiconductor workpiece is increased to be sufficient to resist the at least one back end process without damage.

In various embodiments, the semiconductor workpiece may have a thickness of less than or equal to about 50 μm (e.g. ≤50 μm), for example less than or equal to about 40 μm, for example less than or equal to about 35 μm, for example less than or equal to about 30 μm, for example less than or equal to about 25 μm, for example, less than or equal to about 20 μm, for example in the range from about 1 μm to about 50 μm, for example in the range from about 10 μm to about 40 μm, for example in the range from about 20 μm to about 35 μm, for example in the range from about 20 μm to about 30 μm, for example in the range from about 15 μm to about 25 μm, for example about 50 μm, for example about 40 μm, for example about 35 μm, for example about 30 μm, for example about 25 μm, for example about 20 μm. In accordance with other embodiments, the workpiece may have a different thickness, for example greater than 50 μm.

In various embodiments, the at least one conductive layer (e.g. metallization layer) may have a thickness of greater than or equal to about 10 μm (e.g. ≤10 μm), for example greater than or equal to about 20 μm, for example greater than or equal to about 30 μm, e.g. greater than or equal to about 40 μm, e.g. greater than or equal to about 50 μm, for example in the range from about 10 μm to about 50 μm, for example in the range from about 20 μm to about 40 μm, for example in the range from about 20 μm to about 30 μm, for example in the range from about 30 μm to about 50 μm, for example in the range from about 30 μm to about 40 μm, for example in the range from about 40 μm to about 50 μm, for example about 50 μm, for example about 40 μm, for example about 30 μm, for example about 20 μm, for example about 10 μm. In accordance with other embodiments, the at least one conductive layer (e.g. metallization layer) may have a different thickness.

In a non-limiting example, the semiconductor workpiece may have a thickness of less than or equal to about 50 μm, for example in the range from about 1 μm to about 50 μm, and the at least one conductive layer (e.g. metallization layer) may have a thickness of greater than or equal to about 10 μm, for example in the range from about 10 μm to about 50 μm.

In a further non-limiting example, the semiconductor workpiece may have a thickness in the range from about 20 μm to about 50 μm and the at least one conductive layer (e.g. metallization layer) may have a thickness in the range from about 20 μm to about 40 μm.

In the context of various embodiments, the at least one conductive layer (e.g. metallization layer) may include a material that has a resistivity of less than or equal to about $1\times10^{-6}$ Ωm, for example less than or equal to about $5\times10^{-7}$ Ωm, for example less than or equal to about $1\times10^{-7}$ Ωm, for example less than or equal to about $5\times10^{-8}$ Ωm, for example less than or equal to about $3\times10^{-8}$ Ωm, for example less than or equal to about $2\times10^{-8}$ Ωm.

In the context of various embodiments, the at least one conductive layer (e.g. metallization layer) may include or consist of at least one of a metal and a metal alloy, for example at least one material selected from a group of materials, the group consisting of: copper (Cu), tin (Sn), nickel (Ni), gold (Au), silver (Ag), palladium (Pd), zinc (Zn), iron (Fe), titanium (Ti), an alloy including at least one of the aforementioned materials, e.g. an Au/Sn alloy. In accordance with one or more embodiments, the at least one conductive layer may include or consist of a conductive plastic material.

In various embodiments, the at least one conductive layer (e.g. metallization layer) may include a solderable material. This may mean a material that may be used for soldering, and/or a material suitable for soldering, and/or a material compatible with a soldering process.

In the context of various embodiments, at 104, depositing the at least one conductive layer (e.g. metallization layer) may include a pattern plating process. As a non-limiting example, the pattern plating process may include: depositing a mask layer over the second side of the semiconductor workpiece; patterning the mask layer to form a patterned mask layer covering a kerf region of the semiconductor workpiece; depositing the at least one conductive layer (e.g. metallization layer) between the patterned mask layer by means of plating; removing the patterned mask layer.

In various embodiments, the method may further include attaching at least one die obtained by dicing the semiconductor workpiece to at least one lead frame. Attaching the at least one die to the at least one lead frame may include, for example, at least one of a die pick process and a die attach process.

Figure 1B:
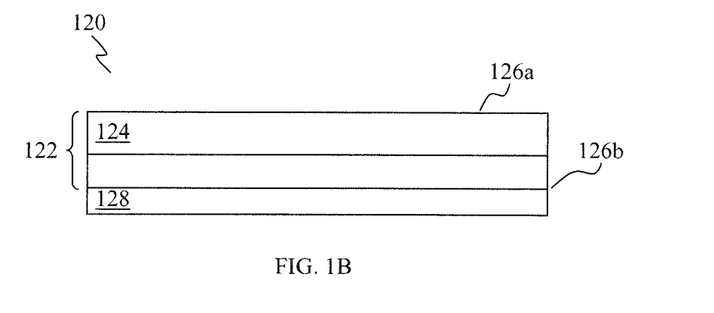
FIG. 1B shows a schematic cross sectional view of a semiconductor device, according to various embodiments.

FIG. 1B shows a schematic cross sectional view of a semiconductor device 120, according to various embodiments. The semiconductor device 120 includes a semiconductor workpiece 122 including a device region 124 at a first side 126a of the semiconductor workpiece 122, wherein a mechanical stability of the semiconductor workpiece 122 is insufficient to resist at least one back end process without damage (e.g. mechanical damage such as chipping, cracks, or the like), and at least one conductive layer (e.g. metallization layer) 128 deposited over a second side 126b of the semiconductor workpiece 122 opposite the first side 126a of the semiconductor workpiece 122, wherein the at least one conductive layer (e.g. metallization layer) 128 increases the mechanical stability of the semiconductor workpiece 122 to be sufficient to resist the at least one back end process without damage.

In other words, the semiconductor workpiece 122 of the semiconductor device 120 includes a device region 124 at a first side (e.g. front side) 126a. The device region 124 may be adjacent to the front side 126a. The device region 124 may form part of the semiconductor workpiece 122 or may be embedded with or integral to the semiconductor workpiece 122. The semiconductor workpiece 122 may be such that, on its own, its mechanical stability may be insufficient to resist or withstand at least one back end process or processing step without damage to the semiconductor workpiece 122. At least one conductive layer (e.g. metallization layer) 128 may be deposited over a second side (e.g. back side) 126b of the semiconductor workpiece 122. The at least one conductive layer (e.g. metallization layer) 128 may provide mechanical support for the semiconductor workpiece 122. The at least one conductive layer (e.g. metallization layer) 128 may increase the mechanical stability of the semiconductor workpiece 122 to be sufficient to resist or withstand the at least one back end process or processing step without damage or with minimal damage to the semiconductor workpiece 122.

It should be appreciated that the illustration in FIG. 1B may not be to scale and may be exaggerated for ease of understanding and clarity. For example, the thicknesses of the different features or layers, either individually or in relation to the others, may not be to scale. In addition, it should be appreciated that any one of or each of the device region 124 or the at least one conductive layer (e.g. metallization layer) 128 may be disposed throughout the entire width of the semiconductor workpiece 122, as shown in FIG. 1B, or along a partial width of the semiconductor workpiece 122.

In the context of various embodiments, a thickness of the semiconductor workpiece 122 may be such that the mechanical stability of the semiconductor workpiece 122 is insufficient to resist the at least one back end process without damage, and a thickness of the at least one conductive layer (e.g. metallization layer) 128 may be such that the mechanical stability of the semiconductor workpiece 122 is increased to be sufficient to resist the at least one back end process without damage (e.g. mechanical damage such as chipping, cracks, or the like).

In various embodiments, the semiconductor workpiece 122 may have a thickness of less than or equal to about 50 μm (for example, in the range from about 1 μm to about 50 μm) and the at least one conductive layer (e.g. metallization layer) 128 may have a thickness of greater than or equal to about 10 μm (for example, in the range from about 10 μm to about 50 μm).

In various embodiments, the at least one conductive layer (e.g. metallization layer) 128 may have a thickness that is about the same as a thickness of the semiconductor workpiece 122.

In various embodiments, the semiconductor device 120 may have a thickness of less than or equal to about 100 μm, e.g. less than or equal to about 90 μm, e.g. less than or equal to about 80 μm, e.g. less than or equal to about 70 μm, e.g. less than or equal to about 60 μm, e.g. less than or equal to about 50 μm, e.g. less than or equal to about 40 μm.

In the context of various embodiments, the device region 124 may include an active region of the semiconductor device 120. The term "active region" may mean a region where charge carriers may be injected into. In a non-limiting example, the active region may include a p-n junction including a p-doped region and an n-doped region.

In the context of various embodiments, the semiconductor workpiece 122 may include a substrate region disposed between the device region 124 of the semiconductor workpiece 122 and the at least one conductive layer (e.g. metallization layer) 128. In various embodiments, the substrate region may be free of any devices.

In the context of various embodiments, the at least one conductive layer (e.g. metallization layer) 128 may be deposited over the second side 126b of the semiconductor workpiece 122 by means of a plating process.

In the context of various embodiments, the at least one conductive layer (e.g. metallization layer) 128 may include or consist of a metal or metal alloy, e.g. at least one material selected from the following group of materials, the group consisting of: copper (Cu), tin (Sn), nickel (Ni), palladium (Pd), gold (Au), an alloy including at least two of the aforementioned materials, an alloy including gold (Au) and tin (Sn). In accordance with other embodiments, the at least one conductive layer 128 may include or consist of an electrically conductive plastic material.

In the context of various embodiments, the semiconductor workpiece 122 includes a semiconductor material. The semiconductor material may include at least one material selected from the following group of materials, the group consisting of: silicon (Si), germanium (Ge), a III-V compound semiconductor material, a IV-IV compound semiconductor material, a II-VI compound semiconductor material, silicon carbide (SiC), gallium arsenide (GaAs), indium gallium arsenide (InGaAs), indium phosphide (InP). As a non-limiting example, a III-V compound semiconductor material may mean a compound having at least one group III element (e.g. Ga and/or In) and at least one group V element (e.g. N and/or P).

In the context of various embodiments, the first side 126a of the semiconductor workpiece 122 may be a front side of the semiconductor workpiece 122 and the second side 126b of the semiconductor workpiece 122 may be a back side of the semiconductor workpiece 122.

In the context of various embodiments, the semiconductor workpiece 122 includes a wafer or die. The device region 124 may be part of the wafer or die. The substrate region may be part of the wafer or die. In various embodiments, the device region 124 and the substrate region may form or be part of the wafer or die.

In the context of various embodiments, the semiconductor device 120 may include a vertically integrated component. The vertically integrated component, for example, may be or may include a vertical diode (e.g. through-silicon (TS) diode), or a vertical transistor.

In the context of various embodiments, the semiconductor device 120 may be or may include a logic device, e.g. a logic die or logic chip.

In the context of various embodiments, the semiconductor device 120 may be or may include an electrostatic discharge (ESD) protection device.

In various embodiments, the semiconductor device 120 may further include a carrier attached to the at least one conductive layer (e.g. metallization layer) 128. The carrier may be attached to a side of the at least one conductive layer (e.g. metallization layer) 128, which faces away from the semiconductor workpiece 122. In various embodiments, the carrier may include a metal or metal alloy. The carrier may be a metal carrier. The carrier may include at least one material selected from the following group of materials, the group consisting of: copper (Cu), aluminum (Al), silver (Ag), nickel (Ni) an alloy including one or more of the aforementioned materials.

In the context of various embodiments, the carrier may include or may be a lead frame.

In the context of various embodiments, the carrier may have a thickness in the range from about 30 μm to about 3 mm, for example in the range from about 30 μm to about 100 μm, for example in the range from about 150 μm to about 250 μm, for example in the range from about 1 mm to about 3 mm.

Various embodiments may provide a semiconductor device. The semiconductor device may include a semiconductor workpiece including a device region at a first side of the semiconductor workpiece, wherein the semiconductor workpiece has a thickness of less than or equal to about 50 μm, and at least one conductive layer (e.g. metallization layer) deposited over a second side of the semiconductor workpiece opposite the first side of the semiconductor workpiece, wherein the at least one conductive layer (e.g. metallization layer) has a thickness of greater than or equal to about 10 μm. In various embodiments, the semiconductor device may further include a lead frame attached to the at least one conductive layer (e.g. metallization layer).

Various embodiments may provide a semiconductor device. The semiconductor device may include a wafer including a device region at a front side of the wafer, wherein the wafer has a thickness of less than or equal to about 50 μm, and a back side metallization covering a back side of the wafer except for a kerf region of the wafer, wherein the back side metallization has a thickness of greater than or equal to about 10 μm.

Various embodiments may provide a semiconductor device. The semiconductor device may include a die including a device region at a front side of the die, wherein the die has a thickness of less than or equal to about 50 μm, and a back side metallization formed at a back side of the die, wherein the back side metallization has a thickness of greater than or equal to about 10 μm. In various embodiments, the semiconductor device may further include a lead frame attached to the back side metallization.

In the context of various embodiments, the term "device region" may mean a region where device performance or function is provided. The device region may include one or more devices or components, for example passive device(s) and/or active device(s).

In the context of various embodiments, the term "mechanical stability" as applied to a semiconductor workpiece may mean the mechanical property or characteristic, for example the mechanical strength of the semiconductor workpiece.

In the context of various embodiments, the damage that may result from at least one back end process may include non-limiting examples of warping, chipping, or cracking.

In the context of various embodiments, the at least one conductive layer (e.g. metallization layer) (e.g. 128) or the back side metallization may be a single layer, or a plurality of layers (e.g. two, three, four or any higher number), for example arranged one over the other, e.g. in a stack arrangement.

In the context of various embodiments, the term "kerf region" may mean a region or area of the semiconductor workpiece where dicing (e.g. sawing) may be carried out. For example, the kerf region may separate a device region from another device region, meaning that the kerf region is located between device regions. In this way, the kerf region may serve as a boundary of a device region. Dicing along the kerf region may then separate individual device regions. Furthermore, a semiconductor workpiece may include a plurality of dies or chips and the kerf region may be located between the dies or chips such that dicing may be performed along the kerf region to separate individual dies or chips.

In the context of various embodiments, the term "lead frame" may mean a component, substrate or housing that includes conductive (e.g. metal) leads that extend externally from the lead frame for electrical connections, for example, to external components or devices.

FIGS. 2A to 2D show, as cross-sectional views, various processing stages of a method for manufacturing a semiconductor device, according to various embodiments.

Figure 2A:
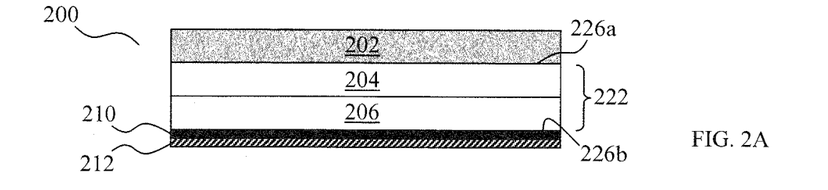
FIGS. 2A to 2D show, as cross-sectional views, various processing stages of a method for manufacturing a semiconductor device, according to various embodiments.

FIG. 2A shows a through-silicon (TS) diode 200. It should be appreciated that, before a wafer dicing process is carried out, the TS diode 200 may be part of a larger wafer having a plurality of TS diodes.

The TS diode 200 includes a carrier wafer 202 which is used for mechanical stabilization during wafer manufacturing in preassembly. The carrier wafer 202 may be eventually removed and not form part of the eventual or final product or device. The TS diode 200 further includes a silicon (Si) area 204 which contains the device, where the Si area 204 may be termed as a device region or area. The TS diode 200 further includes a silicon (Si) area 206 below the device and the device region 204, where the Si area 206 may be termed as a substrate region or area.

The device region 204 and the substrate region 206 may be part of a wafer 222. The device region 204 may be disposed at or adjacent a front side 226a of the wafer 222 or the TS diode 200 while the substrate region 206 may be disposed at or adjacent a back side 226b of the wafer 222 or the TS diode 200. The substrate region 206 mechanically stabilizes the device region 204 and is used for electric current flow to the wafer backside 226b.

The TS diode 200 further includes a stack arrangement 210 or sequence of aluminum (Al) and titanium (Ti). Aluminum may be employed for creating a backside contact between silicon (Si) of the silicon area 206 and a backside (BS) metal or metallization layer to be formed in a later process. Titanium may be employed to act as a diffusion barrier for the subsequent BS metal to be deposited. The stack arrangement 210 may be formed over the substrate region 206. The layer stack or stack arrangement 210 may include or consist of other suitable materials, e.g. other suitable contact forming materials than aluminum (Al) and/or other diffusion barrier materials than titanium (Ti).

The TS diode 200 further includes a seed layer 212, e.g. a copper (Cu) seed layer. The seed layer 212 may be formed over the stack arrangement 210, e.g. over a side of the stack arrangement 210 facing away from the wafer 222. The seed layer 212 may facilitate or promote the growth and/or quality of the layer(s) that may be subsequently formed or deposited over the seed layer 212. The thickness of any one of or each of the stack arrangement 210 or the seed layer 212 may be less than or equal to about 400 nm, e.g. less than or equal to about 300 nm, e.g. less than or equal to about 200 nm, e.g. in the range from about 200 nm to about 400 nm.

Subsequently, a lithography process (e.g. photolithography) may be applied to the wafer backside to define pattern or resist features for pattern plating. A resist, e.g. positive or negative photoresist, (e.g. SU-8, or the like) may be deposited over the seed layer 212, for example by means of spin-coating, to define a mask layer of a defined thickness over the seed layer 212. A thickness of the mask layer may, for example, be in the range from about 5 μm to about 50 μm, although other values of the thickness may be possible as well.

The mask layer may then be patterned to form a patterned mask layer covering a kerf region of the wafer 222. As a non-limiting example using a negative photoresist, portions of the resist layer corresponding to the kerf regions may be exposed to light, e.g. UV emission. Subsequently, the resist layer may be subjected to a development process which removes portions of the resist layer not exposed to light, thereby leaving resist or lithography features at positions corresponding to the kerf regions.

Figure 2B:
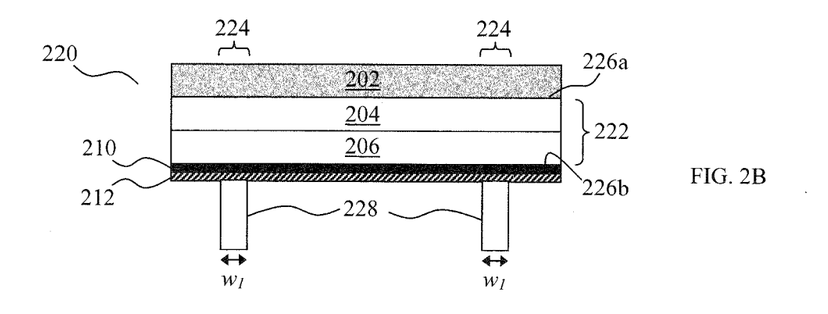

FIG. 2B shows a structure 220 that may be obtained after the lithography process, where the structure 220 includes patterned mask layer or resist features (or lithography features) 228 in the kerf regions 224 of the wafer 222. The resist features 228 may be employed for the subsequent pattern plating process, in order to block or prevent plating in the kerf regions 224. Each resist feature 228 may have a width, $w_1$. The width $w_1$ may, for example, be in the range from about 1 μm to about 1000 μm.

The patterned mask layer or resist features 228 are aligned to the features on the front side 226a of the wafer 222. Several methods may be used to align the backside pattern to the frontside pattern or feature, e.g. infrared (IR) alignment through the wafer 222 before the backside metal deposition and zero layer process block, or direct alignment to features on the wafer front side 226a by an exposure tool, such as with a mask aligner and backside alignment.

A pattern plating process may then be carried out for depositing at least one metallization layer over the seed layer 212 at portions other than the kerf regions 224, e.g. between the resist features 228. Subsequently, the resist features 228 may be removed.

Figure 2C:
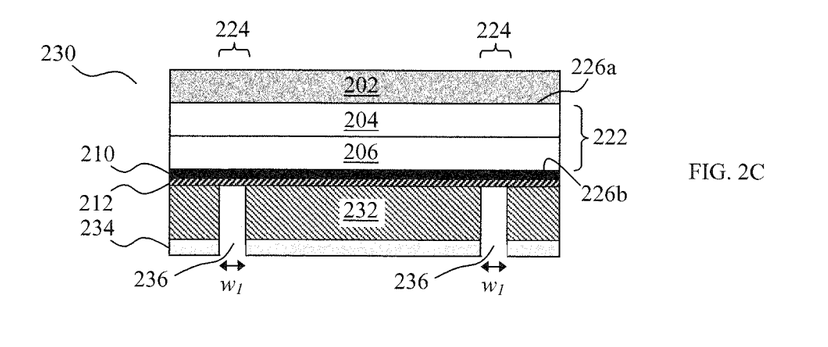

FIG. 2C shows a structure 230 after pattern plating and resist removal. As illustrated, the kerf regions or features 224 are not covered by the metallization layers or plating layers 232, 234, as a result of the presence of the resist features 228 during the pattern plating process. Therefore, the kerf regions 224 may be at least substantially free of the metallization layers 232, 234. The metallization layer 232 may be copper (Cu) of, for example, a thickness of between about 20 μm and 40 μm and may provide the mechanical stability for chip handling in a die attach process. The top of this copper metallization layer 232 may be used as one component of a diffusion solder alloy built together with a layer of tin (Sn) 234, during the die attach process. The growth or formation of the metallization layer 232 may be facilitated by the seed layer 212.

Corresponding to the resist features 228, respective cavities 236 are formed or opened when the resist features 228 are removed, thereby separating the thick metallization layers 232, 234, from die to die. Therefore, the metal stack present at the kerf regions 224 may be due to the stack arrangement 210 and the seed layer 212, and may thus be limited to a few hundred nm of metal.

Figure 2D:
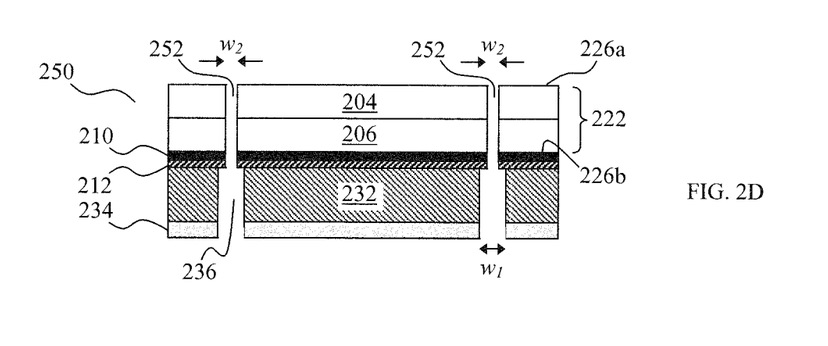

Subsequently, dicing may be carried out along the kerf regions 224 for separating individual dies, for example using a mechanical dicing blade. FIG. 2D shows a structure 250 after the wafer 222 and the TS diode 200 have been frame mounted and GCL (glass carrier light) demounted and mechanically diced. The mechanical dicing blade leaves openings 252 between the silicon of respective chips or dies. The width, $w_2$, of the openings or dicing streets 252 may be less than the width, $w_1$, of the thick copper spacing or cavity 236 at the chip backside (or wafer backside 226b). For example, the width $w_2$ may be in the range from about 5 μm to about 150 μm. The smaller width, $w_2$, coupled with suitable alignment of $w_1$ to $w_2$ may prevent (or at least minimize the risk of) the dicing blade from coming into contact with the copper metallization layer 232. Thus, no or minimal metal may be removed from the copper metallization layer 232 during dicing, and only metal from the stack arrangement 210 and the seed layer 212 are removed or erased by the sawing blade during dicing. Therefore, the amount of metal sticking on the sawing blade may be reduced.

By means of the dicing, one or more, e.g. a plurality of, dies or chips may be obtained, wherein each die or chip may have a thin semiconductor area 204, 206 (e.g. less than or equal to about 50 μm thick, e.g. about 20 μm thick), and a thick metallization 232, 234 (e.g. greater than or equal to about 20 μm thick, e.g. about 20 μm to about 40 μm thick) may be disposed at the back side of the respective die or chip, as shown in FIG. 2D. The thick back side metallization 232, 234 may serve as mechanical stabilization for the semiconductor area 204, 206 in subsequent processing stages, e.g. during die picking and/or die attaching (e.g. to a lead frame).

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for manufacturing a semiconductor device, the method comprising:
    providing a semiconductor workpiece comprising a device region at a first side of the semiconductor workpiece, wherein a mechanical stability of the semiconductor workpiece is insufficient to resist at least one back end process without damage;
    depositing at least one conductive layer over a second side of the semiconductor workpiece opposite the first side of the semiconductor workpiece, wherein the at least one conductive layer increases the mechanical stability of the semiconductor workpiece to be sufficient to resist the at least one back end process without damage,
    wherein depositing the at least one conductive layer over the second side of the semiconductor workpiece comprises covering the second side of the semiconductor workpiece with the at least one conductive layer except for a kerf region of the semiconductor workpiece.

2. The method of claim 1, wherein the at least one back end process comprises at least one of: a preassembly process, an assembly process, a packaging process.

3. The method of claim 1, wherein the at least one back end process comprises at least one of: a dicing process, a die pick process, a die attach process, a wire bonding process.

4. The method of claim 1, further comprising dicing the semiconductor workpiece along the kerf region after depositing the at least one conductive layer.

5. The method of claim 1, wherein the semiconductor workpiece comprises a wafer.

6. The method of claim 1, wherein depositing the at least one conductive layer comprises a plating process.

7. The method of claim 1, wherein a thickness of the semiconductor workpiece is such that the mechanical stability of the semiconductor workpiece is insufficient to resist the at least one back end process without damage, and wherein a thickness of the at least one conductive layer is such that the mechanical stability of the semiconductor workpiece is increased to be sufficient to resist the at least one back end process without damage.

8. The method of claim 1, wherein the semiconductor workpiece has a thickness of less than or equal to about 50 μm.

9. The method of claim 1, wherein the at least one conductive layer has a thickness of greater than or equal to about 10 μm.

10. The method of claim 1, wherein the at least one conductive layer comprises a material that has a resistivity of less than or equal to about $1\times10^{-6}$ Ωm.

11. The method of claim 1, wherein the at least one conductive layer comprises at least one of a metal and a metal alloy.

12. The method of claim 1, wherein the at least one metallization layer comprises at least one material selected from a group of materials, the group consisting of: copper, tin, nickel, gold, silver, palladium, zinc, iron, titanium, an alloy comprising at least one of the aforementioned materials.

13. The method of claim 4, further comprising attaching at least one die obtained by dicing the semiconductor workpiece to at least one lead frame.

14. The method of claim 13, wherein attaching the at least one die to the at least one lead frame comprises at least one of a die pick process and a die attach process.

\* \* \* \* \*